United States Patent
Hamerski

(12) United States Patent (10) Patent No.: US 6,362,112 B1
(45) Date of Patent: Mar. 26, 2002

(54) SINGLE STEP ETCHED MOAT

(75) Inventor: Roman J. Hamerski, Olathe, KS (US)

(73) Assignee: FabTech, Inc., Lee's Summit, MO (US)

( * ) Notice: Subject to any disclaimer, the term of this patent is extended or adjusted under 35 U.S.C. 154(b) by 0 days.

(21) Appl. No.: 09/708,779

(22) Filed: Nov. 8, 2000

(51) Int. Cl.[7] .......................... H01L 21/302
(52) U.S. Cl. ...................... 438/737; 257/107
(58) Field of Search .................... 438/737, 133, 438/135, 138; 257/107, 110, 135

(56) References Cited

U.S. PATENT DOCUMENTS

| | | | |
|---|---|---|---|
| 5,148,241 A | 9/1992 | Sugita | 357/15 |
| 5,278,443 A | 1/1994 | Mori et al. | 257/475 |
| 5,291,051 A | 3/1994 | Hoang et al. | 257/360 |
| 5,914,500 A | 6/1999 | Bakowski et al. | 257/77 |
| 5,949,124 A * | 9/1999 | Hadizad et al. | 257/496 |
| 6,110,763 A * | 8/2000 | Temple | 438/133 |
| 6,204,097 B1 * | 3/2001 | Shen et al. | 438/133 |

* cited by examiner

Primary Examiner—David Nelms
Assistant Examiner—Quoc Hoang
(74) Attorney, Agent, or Firm—Kyle L. Elliott; Blackwell Sanders Peper Martin LLP

(57) ABSTRACT

A single step etched moat (24), having a regular grid work mask (28) of mesa shields (42) and edge termination shields (44), is utilized to form, in a single etching step, semiconductor devices (22) having lengthy edge terminations for reduced edge termination failure. The desired semiconductor devices (22) include a high resistivity, monocrystalline grown substrate layer (30), a low resistivity epitaxial base layer (32), and a low resistivity top layer (36). The regular grid work of mesa shields (42) and edge termination shields (44) define open grid lines (48) and open grid rings (46). The open grid lines (48) are wider than the open grid rings (46), so that as the moats (24) are etched, a deeper grid line divot (50) is formed below the open grid lines (48) and a more shallow grid ring divot is formed below the open grid ring (46).

25 Claims, 2 Drawing Sheets

SINGLE STEP ETCHED MOAT

FIELD OF THE INVENTION

This invention relates to semiconductor devices and methods of manufacturing semiconductor devices and, more particularly, to edge terminations of and methods for forming edge terminations of semiconductor devices by etching moats between individual devices formed on wafers.

BACKGROUND OF THE INVENTION

Semiconductor devices are commonly formed by subjecting wafers of semiconductor material to several processing steps in which various layers and coatings are applied to the wafer. After the desired layers have been applied to the wafer, it is a common practice, particularly in the power semi-conductor business, that moats are etched in the surface of the wafer to separate and define the individual devices. Etching the moats is also one of the steps in forming the edge terminations of the devices.

Failure in semiconductor devices commonly occurs at the edge terminations of the devices where the moats are etched. Such failures are caused by electric field magnitudes that are too large for the edge of the devices. To minimize these failures, edge termination configurations and methods of forming the edge terminations have been developed. Generally, it is advantageous to maximize the length of the edge terminations in the regions of the high resistivity layers of the devices. By maximizing this distance the electric field magnitudes at the edges of the devices is minimized. To increase these distances, methods have employed multiple etching steps thereby controlling the configurations of the edge terminations to maximize the edge termination lengths. While these methods are generally effective to maximize the distances with the desired result of minimizing edge termination failures, the multiple etching steps substantially increase the cost of and time required for manufacturing the devices.

BRIEF SUMMARY OF THE INVENTION

There is, therefore, provided in the practice of the invention a novel method for etching a moat to define semiconductor devices with etched terminations. The method comprises forming a wafer semiconductor material having multiple layers for forming desired semiconductor devices, and masking a surface of the wafer with a mask which includes a plurality of gridlines and at least one grid ring.

In a preferred embodiment, the moat is etched in a single step through a mask having a grid of intersecting and interconnected gridlines and a plurality of grid rings separated from the grid lines by the edge termination etching shields. Preferably, one grid ring is positioned within each device area. As the moat is etched in a single step, grid ring divots are formed beneath the grid rings and grid line divots are formed beneath the grid lines. The ring divots have a ring depth, which increases as the surface of the wafer is etched, and the line divots have a line depth increasing faster than the ring depth as the moat is etched. When the etching process is completed, the line depth is greater than the ring depth. To obtain the variation in depth, the grid rings have a ring width, which is less than a grid line width of the grid lines.

The invention is further directed to a moat mask used in the method for etching the moat. The moat mask includes a grid having a plurality of grid lines corresponding to lines of separation defining a plurality of device areas bounded by the lines of separation for the devices. At least one grid ring is positioned within one of the device areas.

In a preferred embodiment, the mask is created with a layer of photoresist applied to a surface of a wafer. The pattern of grid lines and grid rings creates a plurality of device area etching shields and a plurality of edge termination etching shields spaced from the device area etching shields. In the method, these etching shields are formed on the surface of the wafer.

The invention is further directed to wafers and electrical devices and components formed by these methods.

Accordingly, it is the object of the present invention to provide an improved method for etching a moat to define semiconductor devices with long edge terminations.

It is a further object of the present invention to provide an improved moat mask for forming long edge terminations in substantially a single step.

BRIEF DESCRIPTION OF THE DRAWINGS

These and other inventive features, advantages, and objects will appear from the following Detailed Description when considered in connection with the accompanying drawings in which similar reference characters denote similar elements throughout the several views and wherein.

For the purpose of clarity in illustrating the characteristics of the present invention, accurate proportional relationships of the elements thereof have not been maintained in the Figures. Further, the sizes of certain small devices and elements thereof have been exaggerated.

DETAILED DESCRIPTION

Figure 1:
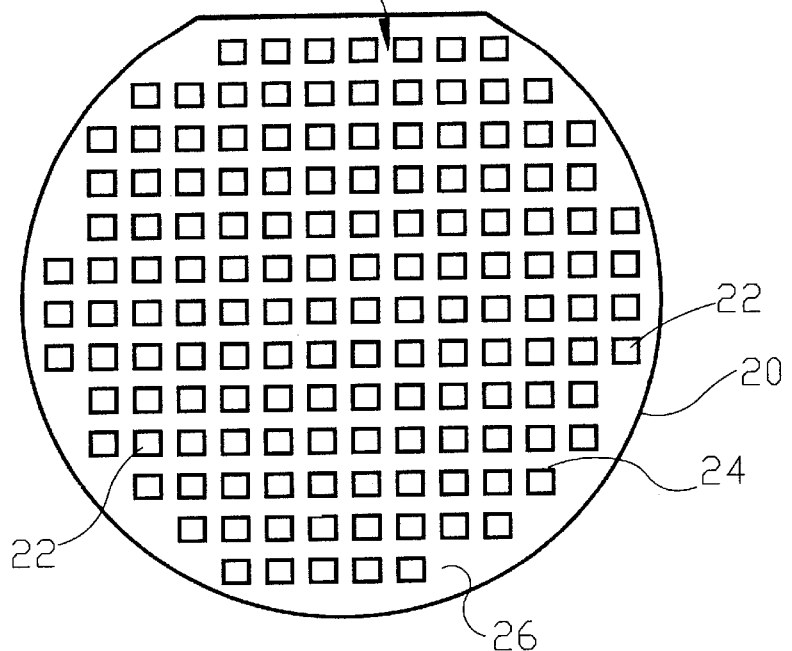
FIG. 1 is a schematic top view of a wafer of semiconductor material having a mask formed thereon for etching the grid of moats in a single etching step.
Figure 2:
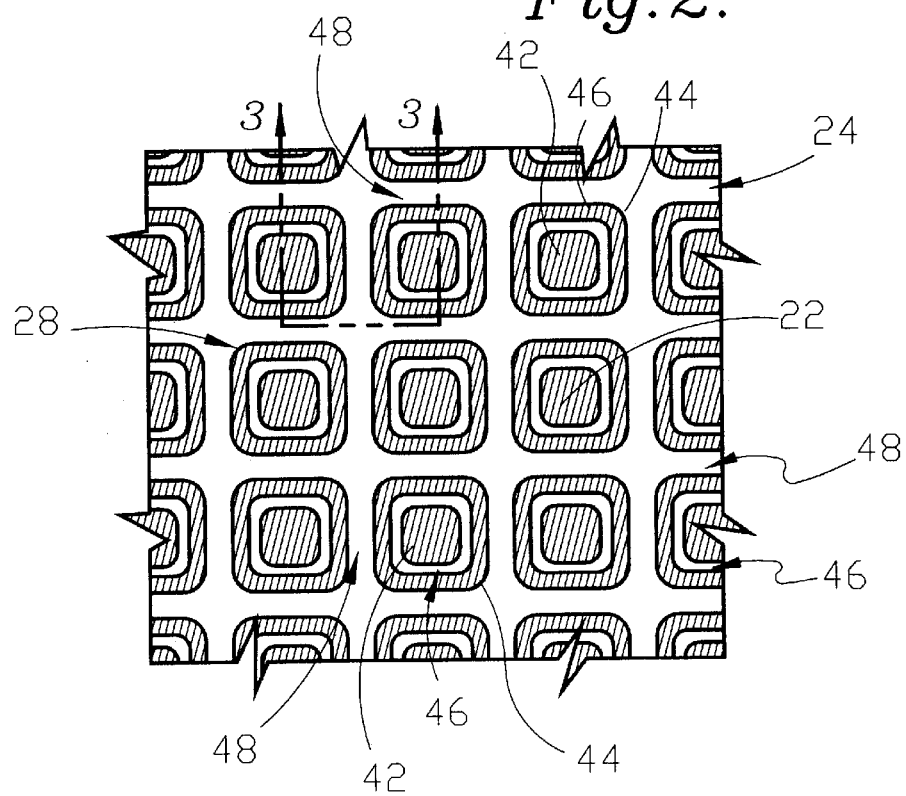
FIG. 2 is an enlarged, fragmentary top view of a portion of the wafer of FIG. 1 having the mask according to the present invention applied thereto and the mask being cross hatched for clarity.

Referring to the drawings in greater detail, FIGS. 1 and 2 show a wafer 20 undergoing a fabrication process in accordance with a preferred embodiment of the present invention. The wafer 20 broadly includes a plurality of multiple layer electrical devices 22 defined and separated by a grid of moats 24 formed in a top surface 26 of the wafer 20. The moats 24 are formed in a single etching step utilizing a mask 28 (FIG. 2).

Figure 3:
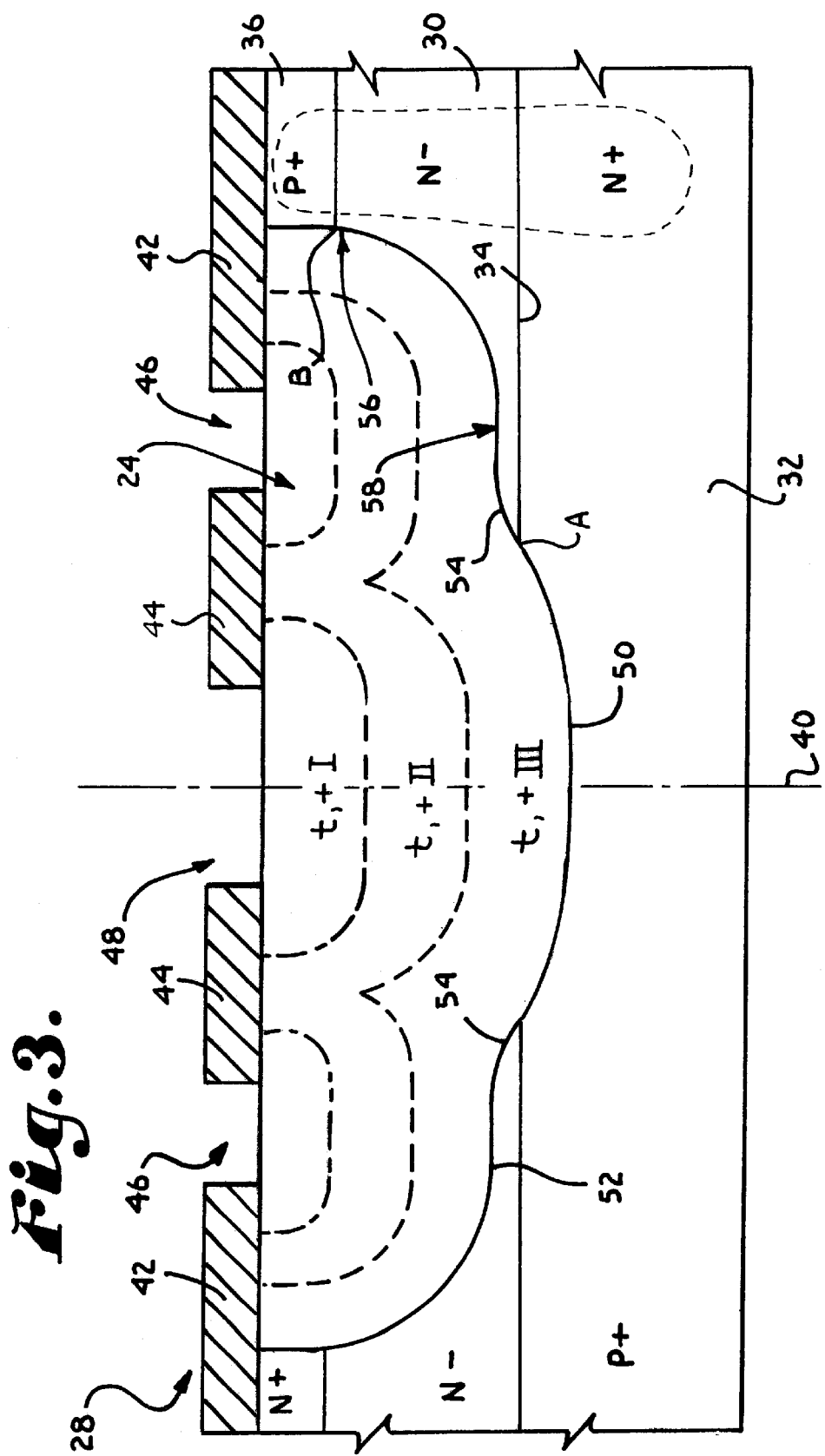
FIG. 3 is an enlarged, fragmentary, vertical cross-sectional view of the wafer of FIG. 1 taken along line 3—3 and illustrating formation of a moat in the wafer.

Referring additionally to FIG. 3, the devices 22 include multiple layers of semiconductor material. In a preferred embodiment, a substrate layer 30, which is the wafer 20 in its original form, is formed by a monocrystalline growth method generally well known in the industry. In the preferred growth method according to the present invention, a pool of lightly doped liquid semiconductor material is seeded with a small crystal. As the seed is slowly drawn out of the pool, the molten silicon aligns with the lattice structure of the seed crystal to form the generally cylindrical ingot (not shown) of semiconductor material, which is preferably silicon. The high quality semiconductor material can also be fabricated with the float zone method also generally well known in the industry.

In a preferred embodiment illustrated on the left side of FIG. 3, the substrate layer 30 has a substrate layer conductive type, which is preferably N⁻ type. Thus, the dopant/ impurity level in the pool is low, so that the substrate layer has a high resistivity to conducting current. A base layer 32 is formed contiguous with a lower first surface 34 of the substrate layer 30. The base layer 32, which is preferably an epitaxial layer, is highly doped with a base dopant, and thus, the base layer 32 has a low resistivity. The base layer conductive type is preferably P⁺ type. A top layer 36 has a preferred top layer conductive type of N⁺, and is formed contiguous with the substrate layer upper second surface 38. The top layer 36 is preferably formed by diffusing an N-type dopant into the top surface 26, but the top layer could also be an epitaxial layer. The N⁺ layer is identified as the top layer and the surfaces are referred to as upper and lower only to clearly identify these features in the orientation of the device as shown in the drawings. Utilizing the substrate layer as the high resistivity layer allows the diodes to be used in high voltage applications namely 1750 Volts and higher, and the preferred embodiment of the layer conductivity types creates a positive bevel angle, which minimizes peak electrical field on the surface improving reverse blocking capability and reliability of the diodes. In an alternate embodiment, enclosed in a dashed line on the right side of FIG. 3, the base layer 32 is N⁺ and the top layer is P⁺. If for any reason, cost for example, the structure shown by FIG. 3 is created starting with the low resistivity layer 32 as an original wafer, the present invention would be applicable with all its benefits.

Though the particular dopants used to achieve the conducting layers of the present invention will not be described particularly, it should be understood that boron can be used as a P-type dopant while phosphorous, arsenic, and antimony can be used as N-type dopants for silicon. Similarly, the semiconductor material can be silicon, germanium, or any compound semiconductor material such as gallium arsenide with appropriate changes to the dopant material depending on the semiconductor material selected.

The moats 24 are preferably a regular grid work of linear intersecting divots formed in the top surface 26 of the wafer 20. The moats correspond to lines of separation 40, which are substantially centrally positioned in the moats 24 and define and bound the separate device areas. The device areas are the portions of the wafer left after separation occurs along the lines of separation 40 to divide the devices 22. The mask 28 preferably comprises a photoresist layer applied to the top surface 26 of the wafer 20 creating the pattern of the moats 24 as illustrated in FIGS. 1 and 2, and the mask is operable to create the vertical section profile of the moats as illustrated in FIG. 3. The mask includes a plurality of mesa area etching shields 42 and a plurality of perimeter edge termination etching shields 44.

The mesa shields 42 and edge shields 44 define a plurality of open grid rings 46 positioned within the device areas. Preferably, one grid ring 46 is positioned in each device area. However, multiple edge shields can be provided to form multiple grid rings. The edge termination etching shields 44 also define the grid work of open grid lines 48, which also correspond to the lines of separation 40. The mesa and edge shields 42, 44 are generally rectangular, preferably square, and the mesa shields 42 correspond to the mesas of the devices. Each edge shield 44 surrounds and is spaced from the perimeter outer limits of one of the mesa shields 42. One of the open grid rings 46 separates each pair of the edge and mesa shields by a substantially constant distance around the perimeter of the mesa shields 42. Similarly, the perimeter outer limits of the open grid rings 46 are substantially uniformly spaced from the open grid lines 48 by the edge shields 44. That is, the edge shields have a substantially constant shield width. Adjacent edge shields 44 are spaced apart by the open grid lines 48. The grid rings 46 have a ring width, and the grid lines 48 have a line width preferably greater than the ring width.

In the method of etching the moats 24, the wafer 20 is first formed with the multiple layers 30, 32, 36 to achieve the desired semiconductor devices 22. The top surface 26 is then masked as described above to form the grid of mesa and edge shields 42, 44 which define the open grid rings and lines 46, 48. The wafer is then etched in a single step chemically removing silicon material to form the moats 24. When the etching first begins at time $t_1$, the etching solution only contacts the top surface 26 of the wafer 20. However, as time proceeds more area is etched in the open grid lines 48 than the open grid rings 46 because the grid lines 48 are wider than the grid rings. As illustrated by the dashed line I, which is representative of the etching step at time $t_1+I$, there is a wider and deeper grid line divot/recess 50 below the grid line 48 than the grid rings 46. Thus, as the etching step proceeds from time $t_1$ to time $t_1+II$, the grid line depth of the grid line divot 50 corresponding to the grid line 48 increases faster than the grid ring depth of the grid ring divot 52. The difference in etching rates of the grid line divot 50 and the grid ring divot reduces as the etching time approaches its completion at time $t_1+III$ because the photoresist mask 28 changes to solution as it is undercut by the etching process. Thus, as the single step etching process proceeds, the edge termination etching shields 44 are removed allowing for the smooth tangential transition 54 from the grid line divot 50 to the grid ring divot depth, and the grid line divot 50 extends into the base layer 32. Thus, the open grid rings 46 correspond to a relatively shallow etch while the open grid lines 48 correspond to a relatively deep etch.

The single step etching process results in an edge termination having a generally vertical portion 56 adjacent the mesa of the device wall and a generally horizontal portion 58, so that the length of the edge termination is maximized. More specifically, the vertical and horizontal portions are located, at least in part, in the substrate layer 30, so that the distance from point A, at the base layer 32 intersection, to point B, at the top layer 36 intersection, is maximized. That is the distance traveled following the edge termination between the base and top layers 32, 36 is maximized.

After the etching step, the wafer 20 will be separated along the lines of separation 40. However, both before and after separation, the wafer 20 and the individual devices 22 are further processed to form a plurality of desired semiconductor devices, preferably diodes according to the described method. For example, any photoresist material left after etching will be removed. It is recognized and anticipated that the devices may be any electrical device having semiconductor characteristics used in the art, such as transistors, light emitting diodes, and others, and accordingly, it is intended that the claims shall cover all such electrical devices that do not depart from the spirit and scope of the present invention. The electrical devices may then be completed and packaged or implemented in an electrical circuit by any conventional method or process known in the art. For example, after the moats are etched, the devices are passivated and then separated from each other. Additionally, switching speed is controlled by a high temperature diffusion step, which may be performed before the devices are separated from each other.

The single step etched moat 24 according to the present invention provides an edge termination minimizing edge termination failures and allowing the devices 22 to be utilized in high voltage applications in the range of 1750 Volts and higher. Further, etching the moats in a single step reduces fabrication time and cost.

Thus, a method of forming a semiconductor device is disclosed which utilizes a single step etched moat to form lengthy edge terminations thereby reducing edge termination failure while also reducing fabrication time and cost. While preferred embodiments and particular applications of this invention have been shown and described, it is apparent to those skilled in the art that many other modifications and applications of this invention are possible without departing from the inventive concepts herein. It is, therefore, to be understood that, within the scope of the appended claims, this invention may be practiced otherwise than as specifically described, and the invention is not to be restricted except in the spirit of the appended claims. Though some of the features of the invention may be claimed in dependency, each feature has merit if used independently.

What is claimed is:

1. A method for etching a moat to define semiconductor devices with edge terminations, the method comprising:
    forming a wafer of semiconductor material having multiple layers for forming desired semiconductor devices; and
    masking a surface of the wafer with a mask defining a grid of grid lines corresponding to lines of separation, which define a plurality of device areas bounded by the lines of separation for the desired devices, and the mask defining a plurality of grid rings with the grid rings positioned within the device areas.

2. The method according to claim 1 further comprising etching the surface of the wafer to form an edge termination having a generally vertical portion and a generally horizontal portion maximizing a length of the edge termination.

3. The method according to claim 1 further comprising etching the surface of the wafer in a single etching step to form an edge termination having a generally vertical portion and a generally horizontal portion maximizing a length of the edge termination.

4. The method according to claim 1 further comprising etching the surface of the wafer in a single etching step.

5. The method according to claim 4 further comprising separating the device from the wafer along the lines of separation.

6. The method according to claim 1 wherein masking the surface of the wafer comprises applying a photoresist to the surface.

7. The method according to claim 1 wherein the grid rings comprise a grid ring width, and the grid lines comprise a grid line width greater than the grid ring width.

8. The method according to claim 7 further comprising etching the surface of the wafer in a single etching step to form edge terminations having deep etches corresponding to the grid lines and shallow etches corresponding to the grid rings.

9. The method according to claim 1 wherein the grid lines are interconnected, the grid rings are separated from the grid lines, and each device area has only one grid ring positioned therein.

10. A method for etching a moat to define semiconductor devices with edge terminations, the method comprising:
    forming a wafer of semiconductor material having multiple layers for forming desired semiconductor devices, and the wafer having a surface;
    forming mesa area etching shields on the surface, the mesa area etching shields having perimeter mesa area etching shield boundaries;
    forming at least one edge termination area etching shield on the surface spaced from one of the mesa area etching shields, the at least one edge termination area etching shield defining at least one open grid line, the at least one open grid line corresponding to at least one line of separation; and
    etching the surface of the wafer.

11. The method according to claim 10 further comprising forming a plurality of edge termination area etching shields on the surface, each of the edge termination etching shields being spaced from one of the mesa area etching shields.

12. The method according to claim 11 wherein the edge termination etching shields are spaced from the mesa area etching shields a first width, and adjacent edge termination etching shields are spaced by a second width greater than the first width.

13. The method according to claim 10 wherein forming the at least one edge termination area etching shield comprises forming a perimeter edge termination area etching shield substantially surrounding the one of the mesa area etching shields.

14. The method according to claim 10 wherein etching the surface of the wafer comprises etching the surface of the wafer in a single step to define the semiconductor devices.

15. A method for etching a moat to define semiconductor devices with edge terminations, the method comprising:
    forming a wafer of semiconductor material having multiple layers for forming desired semiconductor devices; and
    masking a surface of the wafer with a mask defining a grid of intersecting and interconnected open grid lines and a plurality of open grid rings separated from the grid lines, wherein the grid of intersecting and interconnected open grid lines correspond to lines of separation defining a plurality of device areas bounded by the lines of separation for the semiconductor devices.

16. The method according to claim 15 wherein there is one grid ring in each device area.

17. The method according to claim 15 further comprising etching the surface of the wafer to form moat rings having a ring depth and to form moat lines having a line depth greater than the ring depth.

18. The method according to claim 15 further comprising etching the surface of the wafer to form moat rings having a ring depth increasing as the surface is etched and to form moat lines having a line depth increasing faster than the ring depth.

19. A wafer including a plurality of semiconductor devices formed in accordance with the method of claim 15.

20. A semiconductor device formed in accordance with the method of claim 15.

21. A method for etching a moat in a single step to define semiconductor devices with edge terminations, the method comprising:
    forming a wafer of semiconductor material having multiple layers for forming desired semiconductor devices; and
    etching a surface of the wafer to form moat rings having a ring depth increasing as the surface is etched and to form moat lines having a line depth increasing faster than the ring depth.

22. The method according to claim 21 wherein etching the surface of the wafer comprises etching the surface so that the line depth is greater than the ring depth.

23. The method according to claim 21 further comprising, prior to etching, masking the surface of the wafer with a mask defining a grid of intersecting and interconnected grid lines and a plurality of grid rings separated from the grid lines.

24. A method for etching a moat to define semiconductor devices with edge terminations, the method comprising:

forming a wafer of semiconductor material having multiple layers for forming desired semiconductor devices;

masking a surface of the wafer with a mask defining a grid of intersecting and interconnected open grid lines and a plurality of open grid rings separated from the grid lines; and etching the surface of the wafer to form moat rings having a ring depth and to form moat lines having a line depth greater than the ring depth.

25. A method for etching a moat to define semiconductor devices with edge terminations, the method comprising:

forming a wafer of semiconductor material having multiple layers for forming desired semiconductor devices;

masking the surface of the wafer with a mask defining a grid a intersecting and interconnected open grid lines and a plurality of open grid rings separated from the grid lines; and etching the surface of the wafer to form moat rings having a ring depth increasing as the surface is etched and to form moat lines having a line depth increasing faster than the ring depth.

* * * * *